(12) United States Patent
Smithson et al.

(10) Patent No.: US 7,271,577 B2
(45) Date of Patent: Sep. 18, 2007

(54) TESTING LOOP IMPEDANCE IN AN RCCB ELECTRICAL TEST CIRCUIT

(75) Inventors: Edward Smithson, Kent (GB); Rongkai Xu, Kent (GB); Agung Kurniawan Sadya Mandala, Kent (GB); Freddie Yun Heng Chin, Kent (GB)

(73) Assignee: Megger Limited, Dover, Kent (GB)

( * ) Notice: Subject to any disclaimer, the term of this patent is extended or adjusted under 35 U.S.C. 154(b) by 0 days.

(21) Appl. No.: 11/506,605

(22) Filed: Aug. 18, 2006

(65) Prior Publication Data
US 2007/0063711 A1 Mar. 22, 2007

(30) Foreign Application Priority Data
Aug. 19, 2005 (GB) ................................. 0517089.9

(51) Int. Cl.
G01R 23/16 (2006.01)
G01R 31/327 (2006.01)
G01R 31/08 (2006.01)

(52) U.S. Cl. .................... 324/76.21; 324/424; 324/527

(58) Field of Classification Search ............. 324/76.21, 324/76.19, 76.12, 76.11, 710, 424, 415, 527, 324/555, 620; 361/1, 42, 102, 109, 114, 361/115; 340/638
See application file for complete search history.

(56) References Cited

U.S. PATENT DOCUMENTS

| | | | | |
|---|---|---|---|---|
| 5,465,287 A | * | 11/1995 | Egozi ..................... | 379/22.02 |
| 6,225,810 B1 | * | 5/2001 | Godo et al. ................. | 324/525 |
| 6,735,066 B2 | * | 5/2004 | Steffen ....................... | 361/119 |
| 7,170,296 B2 | * | 1/2007 | Batten et al. ............... | 324/527 |

FOREIGN PATENT DOCUMENTS

| | | | |
|---|---|---|---|
| GB | 2239530 A | * | 7/1991 |
| GB | 0706663 B | * | 10/1997 |

\* cited by examiner

*Primary Examiner*—Vincent Q. Nguyen
*Assistant Examiner*—Hoai-An D. Nguyen
(74) *Attorney, Agent, or Firm*—Bromberg & Sunstein LLP

(57) ABSTRACT

A method and apparatus for testing the loop impedance in residual current circuit breaker (RCCB) protected circuits is provided. An alternating test current is applied across the phase earth connections of a supply and a plurality of voltage samples are then taken across the connections. The voltage samples are subsequently transformed from time space to frequency space to allow the component due to the test current to be isolated. The loop impedance is then calculated.

35 Claims, 3 Drawing Sheets

US 7,271,577 B2

TESTING LOOP IMPEDANCE IN AN RCCB ELECTRICAL TEST CIRCUIT

This application claims priority to United Kingdom Patent Application No. 0517089.9, filed Aug. 19, 2005.

TECHNICAL FIELD AND BACKGROUND ART

The present invention relates to the measurement of line earth loop impedance in circuits protected by Residual Current Operated Circuit Breakers (RCCBs).

Measurement of the phase—earth loop impedance in an AC power supply is mandatory in many countries (for example, Great Britain). A simple test (with no RCCB present) would involve measuring the voltage between the phase and earth lines as a test current is passed with and without a test resistor of a known value in the circuit. Since loop impedances are typically of the order of 0.5 Ohms a fairly large test current (for example, 20 A) is required if the voltage to measure is to be discernable in the presence of large line voltages (for example, 230 volts), and tens of volts random noise due to loads and generators being switched on the public supply network.

Modern circuits are commonly protected by RCCBs. These detect any imbalance in the current flow in the phase neutral loop, and at relatively low trip levels (around 30 mA) will break the circuit to prevent any danger of personal injury. The simple method outlined above would trip an RCCB since the test current required is higher than the trip value. As indicated above, using a test current with a magnitude less than this trip voltage produces a test voltage that is extremely difficult to measure against the background noise. For instance, a test current of 10 mA and a loop impedance of 0.5 Ohms would produce a voltage result of only 5 millivolts.

For this reason, previous methods of overcoming this difficulty have often relied upon deliberately circumventing the RCCB's current detection facility, thus effectively deceiving the RCCB into accepting a current higher than the trip value. For example, an early weakness of RCCB design was exploited by the device described in European patent EP0295800, which employs a test current gently ramped up from a value below the trip level. However, this technique is ineffective in the context of many modern RCCB types. In general, the design of the RCCB employed must be known for such techniques to find utility. This information is not typically known to the tester.

RCCBs themselves have developed from tripping on AC only (Type AC) to tripping on AC and pulsed DC (Type A) and now to tripping on AC, pulsed DC and also smooth DC. This is a continual process of improving the tripping characteristics of RCCBs to cover any type of leakage current imaginable. It becomes more necessary than ever to use a technique that does not rely on deceiving the RCCB into accepting a test current higher than its rated trip level.

Some such techniques have been suggested but typically provide results that lack sufficient repeatability. An example is described in European patent EP0706663, where the test result is extracted using a switched capacitor n-path filter technique to remove the interference caused by the supply signal.

SUMMARY OF THE INVENTION

According to a first aspect of the present invention, there is provided a method of testing loop impedance in an RCCB protected AC electrical circuit, comprising the steps of: applying an alternating test current to the RCCB protected electrical circuit at a frequency substantially lower than an AC supply signal frequency, the magnitude of the test current being lower than the RCCB trip level, thereby affecting a test voltage between line and earth connections of the electrical circuit; taking, from the test voltage, a plurality of voltage samples across a time period at a rate determined by a sampling frequency; transforming the voltage samples from time space to frequency space, thereby producing a frequency dependent transformed test voltage; and, calculating the loop impedance using a value of the transformed test voltage observed at the test frequency.

According to a second aspect of the present invention, there is provided an apparatus for testing loop impedance in an RCCB protected electrical circuit, comprising: a test signal generator adapted to apply an alternating electrical test signal to the RCCB protected electrical circuit at a frequency substantially lower than an AC supply signal frequency, the magnitude of the test current being lower than the RCCB trip level, thereby affecting a test voltage between line and earth connections of the electrical circuit; a sampler adapted to take, from the test voltage, a plurality of voltage samples across a predetermined time period at a rate determined by a sampling frequency; and, a signal processor, adapted to transform the voltage samples from time space to frequency space, thereby producing a frequency dependent transformed test voltage, and calculate the loop impedance using a value of the transformed test voltage observed at the test frequency.

The present invention utilises the power of signal processing, particularly digital signal processing, to isolate the small voltage induced by the test current. By taking a number of samples, typically over a period of around twenty seconds, random fluctuations in the signal are accounted for and the result offered by the present invention is thus highly repeatable. The transform, typically a Fourier transform, allows the voltage due to the test current to be differentiated from the supply signal (and it's harmonics). It is thus possible for a valuable result to be obtained from a test current below the level that would trip the RCCB. Importantly, the type of RCCB is not relevant to the utility of the present invention and the loop test can be applied to any circuit.

In one preferred embodiment the test frequency is identified by simply searching, after transforming the results to frequency space, for the largest value of the transformed test voltage observed at a frequency substantially below the AC supply signal. However, other methods of establishing which value in frequency space represents the test current are envisaged. For example, the test frequency may be locked in a fixed ratio relationship to the AC supply signal frequency, or to the sampling frequency, or to both. If the test and sample frequencies are locked then the test voltage can be readily identified in the transformed results.

The present invention may utilise a number of techniques to transform the data. In particular, the Fast Fourier Transform (FFT) algorithm may be applied. Alternatively, the Goertzel algorithm may be adopted. Advantageously, the Goertzel algorithm processes real time data, and there is thus no need to provide storage for the measured voltages before they are transformed. A high frequency resolution may be achieved if a High Resolution Fourier Transform (HRFT) is used.

Both the measurement resolution and frequency resolution of the transformed data may be improved using a number of techniques. For example, oversampling may improve the measurement resolution while the addition of zeros to the data set before it is transformed is found to improve the frequency resolution.

Preferably, the method of the present invention further comprises the steps of: comparing each voltage sample with a voltage sample taken one or more AC supply signal time periods previously; and, ignoring, for the purposes of transforming the voltage samples, the current voltage sample and one or more subsequent voltage samples if the comparison shows substantial variation, thus reducing the effect of substantial temporary variations in the magnitude of the test voltage on the calculated loop impedance. Preferably, the voltage samples taken during one or more whole test cycles are ignored if the comparison shows substantial variation.

These cycle by cycle comparisons diminish the harmful effect of substantial variations in the profile of the supply signal. Such incidents are typically due to a significant change (outside the tester's control) in the load on the mains supply system and may seriously degrade the accuracy of the loop test. The comparisons detect such occurrences, and trigger the exclusion of any tainted data from the signal processing. The circuit used to make the comparisons may or may not be the same as that used to take the voltage measurements used by the signal processor.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

Figure 1:
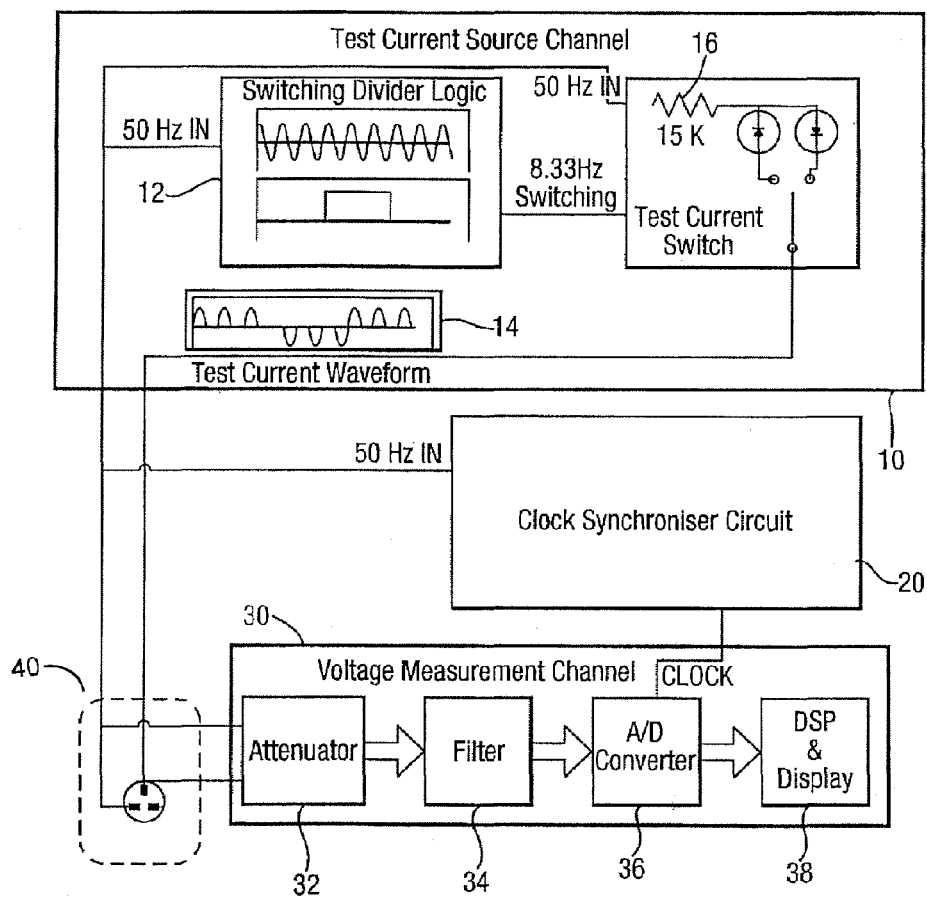
FIG. 1 shows a schematic overview of an apparatus according to the present invention.

FIG. 1 shows a preferred embodiment of the present invention. As shown the apparatus may broadly be considered in three parts: a voltage measurement channel 30; a test current source channel 10; and an optional clock synchroniser 20 used to fix the relative values of the sample and/or test frequencies with that of the supply frequency. All three of these parts are coupled to an RCCB protected supply 40 which provides a supply signal. The supply signal may typically be in the order of 230 volts while a typical RCCB will trip (disabling the system) if it detects a current equal to or greater than 30 mA between the phase/line and earth connections.

The supply signal (with a typical supply frequency of 50 Hz) is applied to each part of the device. The test current source channel 10 causes a test signal, with a frequency substantially below that of the supply signal, to be applied between the phase and earth connections of the supply. The resultant voltage (the test signal) between the connections is sampled across a period of time by an analog-to-digital (A/D) converter 36 in the voltage measurement channel 30.

A signal processor 38 also in the voltage measurement channel transforms the samples from time space to frequency space, allowing the effect of the test current in the test signal to be isolated from that of the supply signal and thus enabling calculation of the loop impedance.

Considering the test current source channel 10 further, FIG. 1 illustrates how the test current is generated by switching between paths having diodes of opposite polarity. The switch is controlled by a switching logic component 12 which generates a switching waveform at the test frequency. As stated previously, the test frequency is chosen to be substantially below the supply frequency. For example, if the supply frequency is 50 Hz the test frequency may be chosen as one sixth of that value (or 8.33 Hz).

The switch thus connects a load resistor 16 (having, in this case, a value of 15 kOhm) between the supply phase connection and the safety earth connection alternately via the diodes of different polarity, thus producing the test current waveform 14 shown in FIG. 1 (which has a large energy content at the test frequency). The value of load resistor 16 is chosen to ensure that the test current does not exceed the trip level of the RCCB (a typical test current may be 15 mA).

Returning to the voltage measurement channel 30 shown in FIG. 1, it will be recalled that this channel is used to sample the voltage between the phase and earth connections of the supply. However, before samples are taken it is desirable to filter out as much of the supply signal frequency as is practically possible. An attenuator 32 is therefore used to reduce the voltage excursions to within the input range of a filter 34. The filter 34 is then able to further reduce the amplitude of the supply fundamental and also to increase the amplitude at the test frequency to produce an optimised input signal range for the A/D converter 36. The A/D converter 36 produces a digitised sample of the input signal at the sampling frequency (in this case 200 Hz) and outputs this to the digital signal processor (DSP) 38.

After a suitable number of samples have been taken (for example, 4000) the DSP transforms the data from a time-varying voltage samples into frequency space/the frequency domain (i.e. a frequency-varying voltage). This transformation may be done in a number of ways, but is commonly effected by a type of discrete Fourier transform (DFT). The complex DFT may be expressed as follows:

$$X(k) = \sum_{n=0}^{N-1} x(n) e^{-j2\pi kn/N} \quad k = 0, 1, 2 \ldots, N-1$$

X(k) is the complex frequency result in frequency space based on the complex summation of weighted samples of the frequency x(n). N represent the total number of samples taken.

Theoretically the Fourier transform is for application to functions of infinite expanse in time. The points at which the sampling begins and ends can therefore have unwanted effects of the results of a transform. For this reason the present invention envisages applying a windowing function to the data before the transform is performed. A number of functions have been used in the signal processing art for this purpose. For example, the Hanning and Blackman functions find utility with certain embodiments of the present invention.

The most common form of DFT algorithm conventionally used is known as the Fast Fourier Transform (FFT). This has been found to be extremely effective in a wide variety of signal processing applications and finds particular utility in the present invention. However, the FFT does require a substantial amount of processing power.

A simpler, less power hungry, algorithm is known as the Goertzel algorithm and has been used in simple signal processing applications where only a small number of frequencies are of interest. For example, the Goertzel algorithm is often used in the context of pure tone detection (such as touch tone telephony). It has been found that the Goertzel algorithm is also effective in the context of the present invention. Advantageously, the Goertzel algorithm may be performed on real-time data (using a few pre-calculated constants) and as such does not require the samples to be stored before the transform is performed. In contrast, an FFT may only be performed with a full set of data, and thus requires a storage device for this data to be included in the present invention.

The use of algorithms, such as the Goertzel, that give accumulating results in real time before all the data has been gathered may be exploited by linear regression (curve-fitting) techniques. Curves are fitted to the running sums of the output of the transform algorithm in such a way as to minimize the standard deviation of the results from the curve.

Consider an xy curve, where x is time in seconds and y is the running sum. In a quiet (i.e. low noise) testing environment the curve should be linear of the form y=ax+b. By comparing the time results against the calculated curve significant noise events may be recognised, allowing the elimination of their effects. Moreover, the standard deviation of the results from the curve will give an indication of the general noise level. Advantageously, if this noise level is found to be low then the final values may be accurately predicted at an early stage in the test. For example, a twenty second test may be completed after only ten seconds if the noise level is found to be low. Alternatively, the test may extended if the noise level is found to be high.

A vital limiting factor on the effectiveness of transformation techniques is their output resolution. As a transform places data in a number of frequency bins (or bands) the resolution may be considered in two parts: a frequency resolution and a measurement resolution. The frequency resolution represents the width of the frequency bins while the measurement resolution represents the accuracy of the voltage result in each bin (and each sample).

The relevance of frequency resolution to the present invention is clear since the test current must be distinguished by its frequency from any background noise or harmonics of the supply signal. In a typical DFT process the width of each frequency bin is proportional to 1/NT (where N is the number of samples while T is the time period). The resolution may therefore be increased simply by increasing either of N or T. However, a large sample size places a heavy burden on the processing power of the signal processor, thus increasing the cost of the apparatus, while it is desirable that the test is completed in a relatively short time.

In order to artificially increase the frequency resolution it is known to introduce a significant number of zeros as extra results to 'pad' out the data. For example, N zeros may be added so that sample size is now 2N (but only half of these results represent true measurements). This does give some improvement in the resolution of the results, and as such this technique may be adopted by some embodiments of the present invention. Nevertheless, there is a practical limit to the number of zeros that may be added.

An alternative method of improving the frequency resolution may be termed a high resolution Fourier transform (HRFT), an example of which has been published by Exstrom laboratories at http://www.exstrom.com/journal/sigproc/specmag.pdf. According to this technique, a high resolution DFT is performed that concentrates solely on a frequency band of interest. This may find utility in the present invention since it is only the test frequency that is of interest.

The measurement resolution will depend on the accuracy of the measurements taken by the A/D converter. Since they convert a continuous signal into a discrete signal, all A/D converters must quantize the results they gather. The number of discrete signal levels available will depend on the bit rating of the converter. For example, a 1 bit converter has only two discrete levels while a 4 bit converter has 16. Highly rated A/D converters therefore provide superior measurement resolution.

However, an increase in the rating of the A/D converter will typically result in an increase in the cost of the required components. A method of increasing measurement resolution without increasing the A/D converter rating is clearly desirable and one such technique that may be used in accordance with the present invention may be termed over-sampling. According to this technique the A/D converter incorporates more than one voltage measurement in each sample transmitted to the signal processor (i.e. the A/D converter runs at a frequency higher than the sampling frequency). Each sample is a summation of a plurality of measurements, and thus may take a larger range of values than a single voltage measurement. For example, if each sample consists of 64 separate A/D conversions then this is equivalent to adding 6 bits to the A/D converter rating.

Once the data has been transformed into frequency space the loop impedance may be calculated from the result obtained at the test frequency. Recall that the test signal is limited to be less than the trip level of the RCCB (typically 30 mA) and that this results in a measured voltage resultant from the test current of the order of millivolts. The use of signal processing techniques separates this data from the extreme noise (a supply signal of hundreds of volts) surrounding it.

Figure 2A:
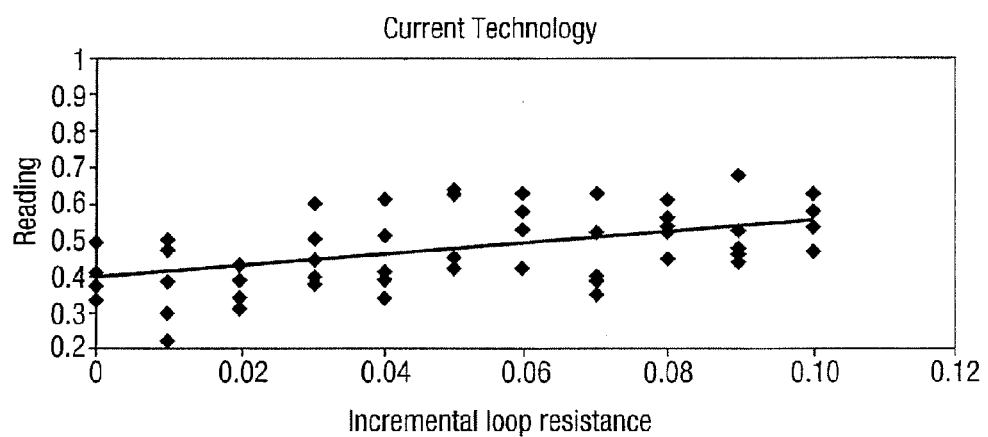
FIG. 2A illustrates the range of results obtained when loop impedance is measured using conventional techniques.
Figure 2B:
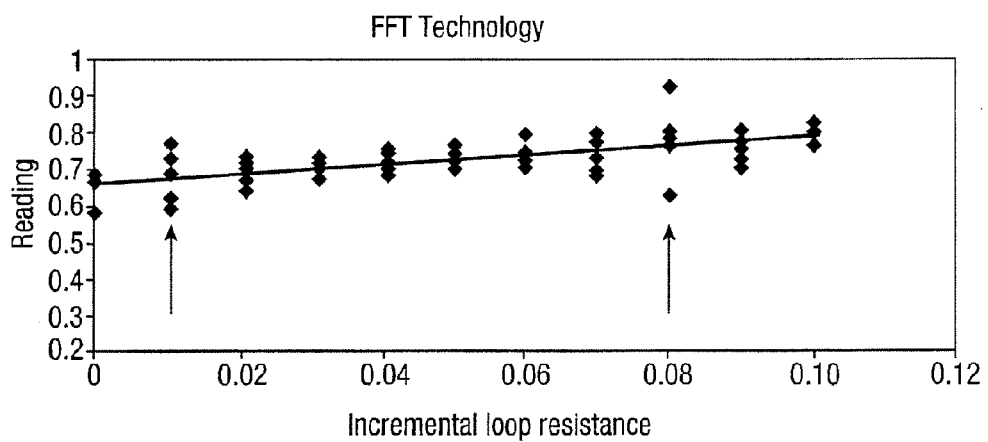
FIG. 2B illustrates the range of results obtained when loop impedance is measured using a Fast Fourier Transform in accordance with the present invention.

The advantage of the use of signal processing is clearly illustrated by the comparison of FIGS. 2A and 2B. FIG. 2A shows results obtained by conventional methods while FIG. 2B shows results obtained through an FFT. With a 15 mA test current sets of 5 readings were taken alternately with each instrument. A further 10 milliohms was added to the earth loop and a further set of 5 readings taken. This process was repeated 10 times. 55 measurements were taken with both instruments. A significant reduction in the variation of test results is shown when adopting the signal processing technique. This amounts to a three-fold improvement in the repeatability of the loop test and, as such, an individual test will provide far greater certainty as to the true value of the loop impedance.

Nevertheless, two of the results (indicated by arrows) shown in FIG. 2B offer a wider variation than is found elsewhere. This is due to extreme noise disturbances in the supply signal. Such disturbances are typically caused by a significant change in load on the grid providing the supply signal and can cause variations of tens of volts compared to normal operational parameters. Measurements taken during such an event corrupt the results of the loop test and add uncertainty to the results.

It would clearly be an advantage to negate the effects of such events. A cycle-by-cycle comparison of the measured voltage may be employed by the present invention in order to detect such instances. According to this technique, the voltage output is sampled at the same point in each supply cycle and the values obtained are compared with adjacent values. If it is found that a substantial (abnormal) variation has occurred then it is assumed that a significant noise event is occurring. In this case, the transform will ignore data relating to an integer number of test current cycles beginning at the point of which the event was detected.

It is important to bear in mind that the amount of data ignored in this way will represent only a relatively small fraction of the samples taken. For example, given a sampling rate of 200 Hz, a test frequency of 8.33 Hz, and a supply signal of 50 Hz, ignoring three test cycles equates to ignoring 0.36 seconds of data. This compares with a time period of 20 seconds. The cycle-by-cycle comparison technique therefore does not have a significantly detrimental effect on the statistical reliability of the loop test.

The cycle-by-cycle comparison may or may not be carried out by the signal processor used for the transform. Indeed, the voltage measurement device may not be that used to measure the sample used in that transform.

Figure 3A:
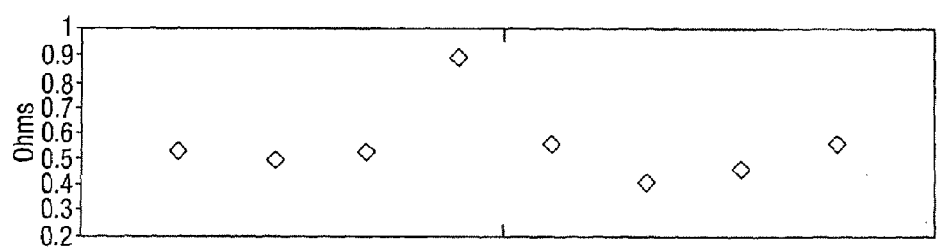
FIG. 3A shows a sequence of loop impedance measurements affected by a substantial supply signal noise event.
Figure 3B:
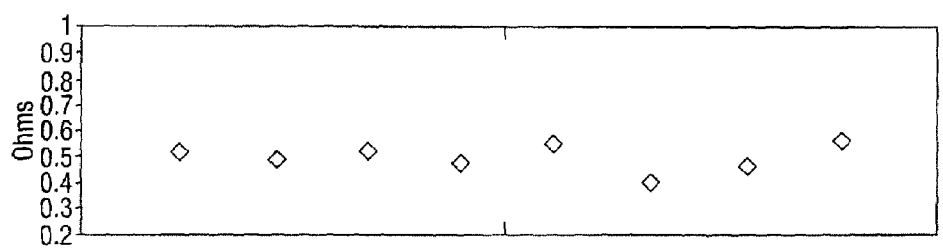
FIG. 3B shows the measurements of FIG. 3A adjusted in accordance with the cycle-by-cycle comparison technique of the present invention.

FIGS. 3A and 3B show a comparison of loop tests performed with and without cycle-by-cycle comparison and the corresponding removal of suspect data. The test results show 8 separate 20 second tests extracted consecutively from a continuous set of data. FIG. 3A represents results without the comparison technique while 24 out of 4000 samples have been removed in accordance with this technique to produce FIG. 3B. As clearly shown in FIG. 3A, the fourth result was affected by an extreme noise event. In contrast, FIG. 3B illustrates that the removal of only 0.6% of the samples has entirely negated the impact of the event. As a result, the standard deviation of the results shown in FIG. 3B is approximately three times less than that of those shown in FIG. 3A.

In order to ensure that samples used for the cycle-by-cycle comparisons are made at the same point in the supply cycle, it is preferable to fix the ratio between the supply frequency and the sampling frequency. FIG. 1 shows a clock synchroniser circuit used for this purpose. The synchroniser circuit will typically comprise of a conventional phase lock loop circuit using the supply signal frequency to control the timing of the A/D converter. Other synchroniser circuits may, however, be used.

The test frequency may also be fixed, via the clock synchroniser circuit or otherwise, in a relationship with the supply and/or sampling frequency. The internal consistency offered by fixing the three operating frequencies in respect of each other ensures that the test frequency is accurately known and that the correct transformed voltage sample is used to calculate the loop impedance.

If the frequencies are not locked to each other it is likely that they will vary or wander with respect to each other and there will thus be a need to identify the test frequency before a calculation of loop impedance may take place. It is envisaged that a simple algorithm may be adopted that searches the transformed data for the maximum voltage result in a frequency region surrounding the expected test frequency. The maximum transformed voltage result in this region will typically represent the test current and can therefore be used to calculate the loop impedance.

In some cases it is preferable to adjust the test frequency to avoid interference from various sources. For example, synchronous equipment (such as motors) are known to generate sub harmonics of the supply signal due to, for example, mechanical imbalances. Accordingly, it may be beneficial to scan the frequency spectrum for such sources of interference in order to determine the most appropriate test frequency.

In some embodiments, the present invention is therefore able to scan the frequency spectrum in the absence of the test signal, using analogous techniques to those described above in the presence of a test signal. Once this background scan is completed the test frequency is adjusted to a favourable (relatively free from interference) area of the spectrum.

The background scan could be used prior to taking any measurements, but could also be used simply as a post-measurement check to establish whether a change in test frequency might have a beneficial effect (that is significant enough to warrant repeating the loop test measurement at that changed frequency).

The value of the loop impedance calculated by the present invention is extremely accurate and reliable. Moreover, the present invention may be used in any type of RCCB protected circuit and does not require any interruption in the power supply. An effective solution is thus presented to the issue of providing mandatory loop tests without any inconvenience to users of the power supply.

While the invention is described through the above-described exemplary embodiments, it will be understood by those of ordinary skill in the art that modifications to, and variations of, the illustrated embodiments may be made without departing from the inventive concepts disclosed herein. Accordingly, the invention should not be viewed as limited, except by the scope and spirit of the appended claims.

What is claimed is:

1. A method for testing loop impedance in an RCCB protected AC electrical circuit, comprising the steps of:
   applying an alternating test current to the RCCB protected AC electrical circuit at a test frequency substantially lower than an AC supply signal frequency, the magnitude of the test current being lower than the RCCB trip level, thereby affecting a test voltage between line and earth connections of the electrical circuit;
   taking, from the test voltage, a plurality of voltage samples across a time period at a rate determined by a sampling frequency;
   transforming the voltage samples from time space to frequency space, thereby producing a frequency dependent transformed test voltage; and,
   calculating the loop impedance using a value of the transformed test voltage observed at the test frequency.

2. A method according to claim 1, further comprising the step of filtering the test voltage prior to the step of taking the plurality of voltage samples.

3. A method according to claim 1, further comprising the step of attenuating the test voltage prior to the step of taking the plurality of voltage samples.

4. A method according to claim 1, wherein the test frequency is chosen in dependence on analysis of the frequency spectrum across the line and earth connections of the electrical circuit in the absence of the test current.

5. A method according to claim 1, wherein each voltage sample comprises a plurality of voltage measurements.

6. A method according to claim 1, wherein the step of transforming the voltage samples comprises performing a Discrete Fourier Transform.

7. A method according to claim 1, wherein the step of transforming the voltage samples comprises performing a Fast Fourier Transform.

8. A method according to claim 1, wherein the step of transforming the voltage samples comprises performing a Goertzel algorithm.

9. A method according to claim 1, wherein the step of transforming the voltage samples comprises performing a High Resolution Fourier Transform.

10. A method according to claim 1, further comprising the step of identifying the test frequency by searching for the largest value of the transformed test voltage at a frequency substantially below the AC supply signal frequency.

11. A method according to claim 1, wherein the test frequency and the supply frequency are locked in a fixed ratio relationship.

12. A method according to claim 1, wherein the sampling frequency and the supply frequency are locked in a fixed ratio relationship.

13. A method according to claim 1, further comprising the step of adding a plurality of zeros to the voltage samples prior to the step of transforming the voltage samples.

14. A method according to claim 1, further comprising the steps of:
comparing each voltage sample with a voltage sample taken one or more AC supply signal time periods previously; and,
ignoring, for the purposes of transforming the voltage samples, the current voltage sample and one or more subsequent voltage samples if the comparison shows substantial variation, thereby reducing the effect of substantial temporary variations in the magnitude of the test voltage on the calculated loop impedance.

15. A method according to claim 14, wherein the voltage samples taken during one or more whole test current cycles are ignored.

16. A method according to claim 1, further comprising the steps of:
observing, over time, a value of the transformed test voltage at a predetermined frequency;
calculating a deviation from linear increase with time of the observed value of the transformed test voltage; wherein,
the time period is dependent on the calculated deviation.

17. A method according to claim 16, wherein the predetermined frequency is the test frequency.

18. An apparatus for testing loop impedance in an RCCB protected AC electrical circuit, comprising:
a test signal generator adapted to apply an alternating electrical test signal to the RCCB protected electrical circuit at a frequency substantially lower than an AC supply signal frequency, the magnitude of the test current being lower than the RCCB trip level, thereby affecting a test voltage between line and earth connections of the electrical circuit;
a sampler adapted to take, from the test voltage, a plurality of voltage samples across a predetermined time period at a rate determined by a sampling frequency; and,
a signal processor, adapted to transform the voltage samples from time space to frequency space, thereby producing a frequency dependent transformed test voltage, and calculate the loop impedance using a value of the transformed test voltage observed at the test frequency.

19. An apparatus according to claim 18, further comprising a filter adapted to increase the relative strength of the test voltage at frequencies substantially similar to an estimated test frequency.

20. An apparatus according to claim 18, further comprising an attenuator adapted to attenuate the test voltage.

21. An apparatus according to claim 18, wherein the test frequency depends on analysis of the frequency spectrum across the line and earth connections of the electrical circuit in the absence of the test current.

22. An apparatus according to claim 18, wherein each voltage sample comprises a plurality of voltage measurements.

23. An apparatus according to claim 18, wherein the signal processor is adapted to perform a Discrete Fourier Transform to transform the voltage samples.

24. An apparatus according to claim 18, wherein the signal processor is adapted to perform a Fast Fourier Transform to transform the voltage samples.

25. An apparatus according to any claim 18, wherein the signal processor is adapted to perform a Goertzel algorithm to transform the voltage samples.

26. An apparatus according to claim 18, wherein the signal processor is adapted to perform a High Resolution Fourier Transform to transform the voltage samples.

27. An apparatus according to any claim 18, further comprising means for identifying the test frequency by searching for the largest voltage sample at a frequency substantially below the AC supply signal frequency.

28. An apparatus according to claim 18, further comprising a clock synchroniser circuit adapted to ensure a fixed ratio relationship between the sampling frequency and the supply frequency.

29. An apparatus according to claim 28, wherein the clock synchroniser circuit is further adapted to ensure a fixed ratio relationship between the test frequency and the supply frequency.

30. An apparatus according to claim 18, further comprising means for comparing a current voltage sample with a voltage sample taken one or more AC supply signal time periods previously; and,
wherein the signal processor is further adapted to ignore, for the purposes of transforming the voltage samples, the current voltage sample and one or more subsequent voltage samples if the comparison shows substantial variation, thus reducing the effect of substantial temporary variations in the magnitude of the test voltage on the calculated loop impedance.

31. An apparatus according to claim 30, wherein the signal processor is adapted to ignore voltage samples taken during one or more whole test current cycles.

32. An apparatus according to claim 30, wherein the signal processor comprises the means for comparing a current voltage measurement with a voltage sample taken one or more AC supply signal time periods previously.

33. An apparatus according to any claim 18, further comprising means to calculate a deviation from linear increase with time of a value of the transformed test frequency observed, over time, at a predetermined frequency, wherein the time period is dependent on the calculated deviation.

34. An apparatus according to claim 33, wherein the predetermined frequency is the test frequency.

35. An apparatus according to claim 18, wherein the signal processor is a digital signal processor.

* * * * *